United States Patent [19]

Ohashi et al.

[11] Patent Number: 4,682,208
[45] Date of Patent: Jul. 21, 1987

[54] TRANSISTOR PROTECTION DEVICE

[75] Inventors: Toshio Ohashi, Atsugi; Shukou Yamamoto, Sano, both of Japan

[73] Assignee: Nissan Motor Co., Ltd., Kanagawa, Japan

[21] Appl. No.: 691,066

[22] Filed: Jan. 14, 1985

[30] Foreign Application Priority Data

Jan. 13, 1984 [JP] Japan ................................. 59-4517

[51] Int. Cl.$^4$ ...................... H01L 23/02; F28F 7/00; H01B 7/34; H02B 1/00
[52] U.S. Cl. .................................... 357/81; 165/80.3; 174/16 HS; 357/74; 361/381
[58] Field of Search ............... 357/81, 74; 174/16 HS, 174/15 HP; 165/80.3, 80.5, 41; 361/380–384, 386–388

[56] References Cited

U.S. PATENT DOCUMENTS 2,958,021 10/1960 Cornelison et al. ............ 174/15 HP
4,535,384 6/1985 Wakabayashi et al. ............. 361/386

FOREIGN PATENT DOCUMENTS 0122149 9/1981 Japan ..................................... 357/81

OTHER PUBLICATIONS

Burry et al, "Multidirectional Expansion Packaging", IBM Technical Disclosure Bulletin, vol. 19, No. 8, Jan. 1977, p. 2960.

Primary Examiner—James W. Davie
Assistant Examiner—Georgia Y. Epps
Attorney, Agent, or Firm—Schwartz, Jeffery, Schwaab, Mack, Blumenthal & Evans

[57] ABSTRACT

A transistor protection device in accordance with the present invention includes a base platform consisting of a flat aluminum board for fixing a power transistor with small screws or the like. A supporting plate is placed at a prescribed distance from the base platform, and the base platform and the supporting plate are separated by means of solid heat conducting rods and hollow rods through which are inserted conductors. The heat conducting rods are arranged to have their top ends to make contact with the bottom surface of the power transistor which is the portion of maximum heat production in the power transistor, in order to conduct the heat generated to the outside of the power transistor. Because of the better radiation capability which takes place in relatively thin rods, there are installed a plurality of the heat conducting rods. Moreover, on the heat conducting rods, in the section between the base platform and the supporting plate, there are provided numerous radiation fins stacked one after another in order to enhance the radiation capability of the heat conducting rods.

9 Claims, 5 Drawing Figures

TRANSISTOR PROTECTION DEVICE

BACKGROUND OF THE INVENTION

1. Field of the invention

The present invention relates to a transistor protection device, more particularly to a transistor protection device for protecting an air-flow controlling transistor for an automobile air conditioner by radiating the heat accumulated in the transistor.

2. Description of the Prior Art

In general, there are various kinds of transistors incorporated in an electrical circuit of an air conditioning device of automobile. Among them, there is in particular a power transistor with relatively large capacity, which is used for adjusting the air-flow amount of a fan through control of the rate of rotation of a fan motor. Namely, the power transistor is adopted for controlling the speed of the fan motor to adjust the flow amount of the air.

The power transistor is installed in the control circuit, and when the fan switch is set at the auto position, an automatic amplifier detects the voltage at point A which is generated in response to the difference between the resistance of PTC (patentio-thermo control) corresponding to a set temperature and the resultant resistance detected by the interior and exterior temperature sensors. The automatic amplifier further detects the voltage at point C which is generated in response to the difference between the two fixed resistances to very the voltage at the base of the power transistor stepwise or continuously in order to change the rotation speed of the fan motor, resulting in controlling the air-flow amount automatically.

However, the power transistor is made of a semiconductor so that it produces heat when an electric current flows through it. Therefore, in the prior art devices, the power transistor is attached to the bottom wall of a radiator which is called a heat sink which is placed in an air duct of an automobile air conditioning device to be cooled forcibly by the air that flows in the duct.

However, in a transistor protection device described above, the radiation efficiency is not sufficiently high, resulting in a decrease in the function, and a shortening of the life, of the transistor.

In addition, since the portion of highest heat production in the power transistor is the bottom portion, it tends to cause a local deterioration of the transistor.

SUMMARY OF THE INVENTION

An object of the present invention is to provide a transistor protection device with high radiation efficiency.

Another object of the present invention is to provide a small and light transistor protection device which is adapted for removing the heat from the power transistor faster.

Another object of the present invention is to provide a transistor protection device which is adapted for uniformly cooling the entirety of the transistor.

Briefly described, these and other objects of the present invention are accomplished by the provision of an improved transistor protection device which includes a base platform for supporting the transistor, heat conduction rods which extend downward from the bottom surface of the transistor that is placed on the base platform for conducting heat generated in the transistor, and radiation fins that are attached to the heat conduction rods.

BRIEF DESCRIPTION OF THE DRAWING

These and other objects, features and advantages of the present invention will be more apparent from the following description of a preferred embodiment, taken in conjunction with the accompanying drawings, in which.

DESCRIPTION OF THE PREFERRED EMBODIMENTS

Figure 1:
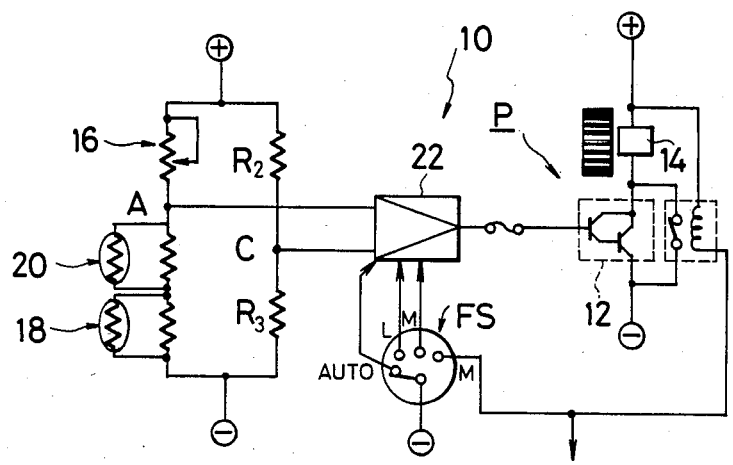
FIG. 1 is a control circuit diagram of a fan for an automobile air conditioning device.

To facilitate an understanding of the present invention, a brief reference will be made of a prior art transistor protection device illustrated in FIGS. 1, 2 and 3.

As shown, there is illustrated an automobile air conditioning device in which an electrical control circuit 10 which includes a power transistor 12 is installed. The power transistor 12 is for adjusting the air-flow through control of the speed of a fan motor 16.

For example, when the fan switch FS in the control circuit 10 is set at the Auto position, the voltage at point A which is generated in response to the difference between the resistance of PTC (potentio-thermo control) 16 corresponding to a set temperature and the resultant resistance detected by the interior and exterior temperature sensors 18 and 20, and the voltage at point C which is generated in response to the difference between the fixed resistances $R_2$ and $R_3$, are detected by an automatic amplifier 22. Then, the voltage at the base of the power transistor 12 is varied stepwise or continuously to change the rotation speed of the fan motor in order to control the air-flow amount automatically.

Figure 2:
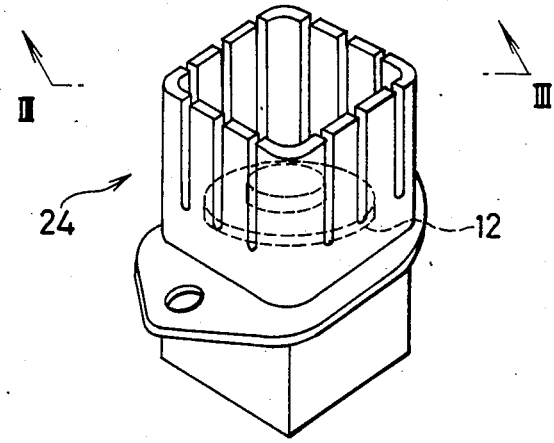
FIG. 2 is a perspective view of a prior art transistor protection device.
Figure 3:
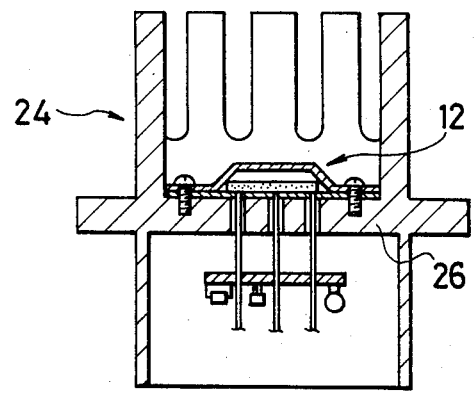
FIG. 3 is a vertical sectional view along the line III—III of the device shown in FIG. 2.

However, the power transistor 12 is made of a semiconductor which produces heat due to electric current, so that in the prior art devices the transistor 12 is fixed to the bottom wall 26 of a radiator 24 called a heat sink, as shown in FIGS. 2 and 3. The radiator 24 is placed in the air duct of the automobile air conditioning device, so that it is cooled forcibly by the air flowing in the air duct.

However, in a transistor protection device described as in the above, the radiation efficiency is not sufficiently high, resulting in a reduction in the function, and a shortening of the life, of the transistor.

The present invention which is aimed at resolving such a problem will be described by referring to FIGS. 4 and 5.

Figure 4:
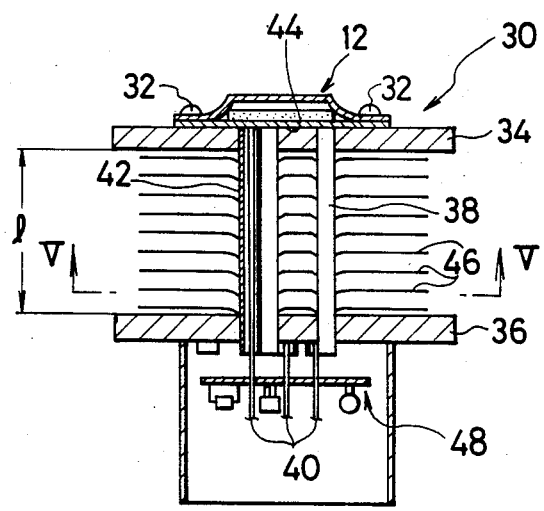
FIG. 4 is a vertical sectional view of an example of a transistor protection device in accordance with the present invention.
Figure 5:
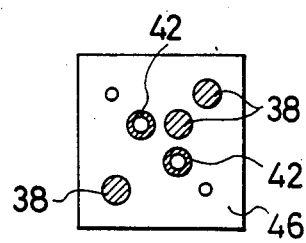
FIG. 5 is a vertical sectional view along the line V—V of the device shown in FIG. 4.

Referring now to FIG. 4, there is shown a transistor protection device in accordance with the present invention with a reference numeral 30.

The transistor protection device 30 includes a base platform 34 comprising a flat aluminum plate to which a power transistor 12 is to be fixed by small screws 32 or the like. At a prescribed distance from the base platform 34 there is placed a supporting plate 36, and the base platform 34 and the supporting plate 36 are separated by solid heat conducting rods 38 and hollow rods 42 through each of which a conductor 40 is inserted. The heat conducting rods 38 and the hollow rods 42 are fixed to the base platform 34 and the supporting plate 36 by means of soldering or the like.

In particular, in the present invention the top ends of the heat conducting rods 38 are arranged to make contact with the lower surface 44 of the power transistor 12 which is the portion of maximum heat production in the power transistor 12 in order to conduct the heat generated in the power transistor 12 to the outside as fast as is possible. Moreover, there are provided a plurality of these heat conducting rods 38 because of the better radiation capability when they are relatively thin. In addition, there are installed numerous radiation fins 46 in a stacking form on the heat conducting rods 38 in the portion between the base platform 34 and the supporting plate 36 in order to enhance the radiation efficiency. Here, it is desirable to connect these radiation fins 46 to the heat conducting rods 38 by means of soldering or the like.

In the portion below the supporting plate 36, there is arranged an amplifier 48 which incorporates various electrical control circuits for the automobile air conditioning device.

When a transistor protection device 30 with the above construction is installed, for example, within the duct for an automobile air conditioning device, radiation from the top surface of the power transistor 12 becomes extremely good since the cooling air makes direct contact with the power transistor 12. Moreover, the heat at the bottom surface of the power transistor 12 which represents the area of maximum heat production will be led to the outside through a plurality of heat conducting rods 38 and the radiation fins 46.

Therefore, because of the sufficiently fast radiation of the generated heat through both of the top and bottom surfaces of the power transistor 12, it becomes possible not only to achieve a marked improvement in the radiation capability but also to prevent local deterioration as a result of uniform cooling of the transistor as a whole.

Moreover, the present transistor protection device 30 does away with the standing installment of numerous radiation fins, so that it can be made small-sized and light-weight, contributing to a reduction in the cost of manufacturing.

In summary, because of the provision of a radiation means at the portion of maximum heat production of the power transistor, the transistor protection device in accordance with the present invention is possible to accomplish an extremely high radiation capability to maintain a long life, and to prevent to deterioration of the function of the transistor. Moreover, it is possible to prevent a local deterioration of the transistor due to approximately uniform cooling of the transistor as a whole. Not only that, extremely excellent advantages such as the ease in handling due to its small size and light weight, and a reduction in the manufacturing cost, and others, can be expected.

Various modifications will become possible for those skilled in the art after receiving the teachings of the present disclosure without departing from the scope thereof.

What is claimed is:

1. A transistor detection device for radiating heat generated in a transistor, comprising:
    a base platform for supporting the transistor;
    heat conducting rods attached to the bottom surface of the transistor and extending away from said bottom surface to conduct heat generated mainly at the bottom surface of said transistor away from said transistor;
    electrically insulated hollow rods attached to the bottom surface of said transistor and receiving conductors extending from said transistor for connecting said transistor to an electrical circuit; and
    a plurality of radiation fins attached to said heat conductive rods to radiate the heat conducted by said rods from the transistor.

2. A transistor protection device as claimed in claim 1, in which each said heat conducting rod comprises a solid bar.

3. A transistor protection device as claimed in claim 1, in which said plurality of radiation fins are installed one on top of another on the heat conducting rods and extend transversely to said heat conducting rods.

4. A transistor protection device as claimed in claim 1, further comprising:
    a supporting plate spaced from the base platform to support the heat conducting rods and the hollow rods, the heat conducting rods and the hollow rods being connected between the supporting plate and the base platform.

5. A transistor protection device as claimed in claim 4, in which said base platform, said heat conducting rods and said radiation fins are installed within a cooling duct of an automobile air conditioning device.

6. A transistor protection device as claimed in claim 3, in which said heat conducting rods and said radiation fins are connected by solder.

7. A transistor protection device as claimed in claim 4, in which said heat conducting rods, said radiation fins, said supporting plate and said base platform are connected to each other by solder.

8. A transistor protection device as claimed in claim 5, in which said heat conducting rods, said supporting plate, said base platform and said hollow rods are connected to each other by solder.

9. A transistor protection device as claimed in claim 1, wherein said transistor is a power transistor.

* * * * *

UNITED STATES PATENT AND TRADEMARK OFFICE
CERTIFICATE OF CORRECTION

PATENT NO. : 4,682,208

DATED : July 21, 1987

INVENTOR(S) : Toshio OHASHI and Shukou YAMAMOTO

It is certified that error appears in the above-identified patent and that said Letters Patent is hereby corrected as shown below:  Title page:

Item [73], change "Nissan Motor Co., Ltd, Kanagawa, Japan" to --Nissan Motor Co., Ltd., Kanagawa, Japan and Nihon Radiator Co., Ltd., Tokyo, Japan--

Signed and Sealed this

Twenty-second Day of March, 1988

Attest:

DONALD J. QUIGG

Attesting Officer

Commissioner of Patents and Trademarks